(12) United States Patent
Eummelen et al.

(10) Patent No.: US 8,416,388 B2
(45) Date of Patent: Apr. 9, 2013

(54) FLUID HANDLING DEVICE, AN IMMERSION LITHOGRAPHIC APPARATUS AND A DEVICE MANUFACTURING METHOD

(75) Inventors: Erik Henricus Egidius Catharina Eummelen, Veldhoven (NL); Koen Steffens, Veldhoven (NL); Takeshi Kaneko, 's-Hertogenbosch (NL); Gregory Martin Mason Corcoran, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 358 days.

(21) Appl. No.: 12/756,754

(22) Filed: Apr. 8, 2010

(65) Prior Publication Data
US 2010/0259735 A1 Oct. 14, 2010

Related U.S. Application Data

(60) Provisional application No. 61/168,426, filed on Apr. 10, 2009.

(51) Int. Cl.
*G03B 27/42* (2006.01)
*G03B 27/52* (2006.01)

(52) U.S. Cl. .......................... 355/53; 355/30

(58) Field of Classification Search .............. 355/30, 355/53, 67; 250/548
See application file for complete search history.

(56) References Cited

U.S. PATENT DOCUMENTS

| | | | |
|---|---|---|---|
| 4,509,852 A | 4/1985 | Tabarelli et al. | |
| 7,532,309 B2 * | 5/2009 | Poon et al. | 355/67 |
| 8,174,668 B2 * | 5/2012 | Kobayashi et al. | 355/30 |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0119809 A1 | 6/2006 | Verhagen et al. | |
| 2008/0212046 A1 | 9/2008 | Riepen et al. | |
| 2009/0279060 A1 | 11/2009 | Direcks et al. | |
| 2010/0060868 A1 | 3/2010 | Tanasa et al. | |
| 2010/0231875 A2 * | 9/2010 | Ten Kate et al. | 355/30 |

FOREIGN PATENT DOCUMENTS

| | | |
|---|---|---|
| CN | 1981365 | 6/2007 |
| EP | 1 420 300 A2 | 5/2004 |
| JP | 2005-347617 | 12/2005 |
| JP | 2006-165500 | 6/2006 |
| JP | 2008-060276 | 3/2008 |
| JP | 2009-212234 | 9/2009 |
| WO | 99/49504 A1 | 9/1999 |
| WO | 2005/064405 A2 | 7/2005 |
| WO | 2007/129753 | 11/2007 |

OTHER PUBLICATIONS

Japanese Office Action mailed Jan. 24, 2012 in corresponding Japanese Patent Application No. 2010-085599.
Chinese Office Action dated Feb. 13, 2012 in corresponding Chinese Patent Application No. 201010162215.5.

* cited by examiner

*Primary Examiner* — Hung Henry Nguyen
(74) *Attorney, Agent, or Firm* — Pillsbury Winthrop Shaw Pittman LLP

(57) ABSTRACT

A fluid handling system for an immersion lithographic apparatus that has a fluid removal device to remove immersion liquid from an immersion space, and a droplet removal device to remove a droplet of immersion liquid, wherein: the droplet removal device is located further from an optical axis than the fluid removal device, and the droplet removal device comprises a porous member which faces, e.g., the substrate being exposed and/or the substrate table.

20 Claims, 9 Drawing Sheets

FLUID HANDLING DEVICE, AN IMMERSION LITHOGRAPHIC APPARATUS AND A DEVICE MANUFACTURING METHOD

This application claims priority and benefit under 35 U.S.C. §119(e) to U.S. Provisional Patent Application No. 61/168,426, entitled "A Fluid Handling Device, An Immersion Lithographic Apparatus and A Device Manufacturing Method", filed on Apr. 10, 2009, The content of that application is incorporated herein in its entirety by reference.

FIELD

The present invention relates to a fluid handling device, an immersion lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Arrows in liquid supply and liquid recovery devices indicate the direction of liquid flow.

FIG. 4 schematically depicts a further exemplary liquid supply system for use in a lithographic projection apparatus, according to an embodiment of the present invention. A liquid is supplied by two groove inlets on either side of the projection system PS and is removed by a plurality of discrete outlets, arranged radially outwardly of the inlets. In the embodiment of FIG. 4, inlets and outlets are arranged within a plate having a hole through which a beam of radiation is projected. Liquid is supplied by one groove inlet on one side of the projection system PS and is removed by a plurality of discrete outlets on the other side of the projection system PS, thereby causing a flow of a thin film of liquid between the projection system PS and the substrate W. The choice of a combination of inlet and outlet incorporated within the liquid supply system can depend on the direction of movement of the substrate W (the other combination of inlet and outlets being inactive). In the cross-sectional view of FIG. 4, arrows in the plate illustrate the direction of liquid flow out of an inlet and into the outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table to support a substrate in which leveling and exposure occurs on that table. In yet another arrangement there are two tables, one of which is configured to support a substrate; the other is to keep immersion liquid in contact with a projection system during, e.g., substrate swap.

PCT patent application publication no. WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system may improve temperature control and processing of the substrate, evaporation of the immersion liquid can still occur. One way of alleviating that problem is described in United States patent application publication no. US 2006/119809 in which a member is provided which covers the substrate W in all positions and which is arranged to have immersion liquid extending between it and the top surface of the substrate and/or substrate table which holds the substrate.

SUMMARY

In immersion lithographic apparatus using an immersion liquid, immersion liquid, such as droplets, may be left on the substrate, substrate table or both. Presence of a droplet in such a location is undesirable. (Note that reference to a droplet hereinafter includes reference to a liquid film). The droplet may collide with a meniscus formed between a liquid confinement structure and a facing surface, such as a substrate, a substrate table or both. On collision a bubble may form in immersion liquid confined by the liquid confinement structure. The bubble may move through the immersion liquid and interfere with exposure radiation to form a defect in the pattern formed on the substrate. The droplet may evaporate applying a heat load to the surface on which it is located. By evaporating and/or forming a drying stain, a droplet may be a source of defectivity for a substrate during exposure.

It is desirable, for example, to provide an apparatus by which unwanted liquid droplets can be more effectively and efficiently removed from the surface of the substrate and/or substrate table. Removal of the droplet may occur before the droplet becomes a source of defectivity, e.g. before colliding with the meniscus of confined immersion liquid or evaporating.

According to an aspect, there is provided an immersion lithographic apparatus comprising:
 a projection system having an optical axis;
 a substrate table configured to hold a substrate, the substrate, a table, or both, defining a facing surface; and
 a fluid handling structure configured to supply an immersion liquid to an immersion space defined between the projection system and the facing surface, the fluid handling structure comprising:
  a fluid removal device arranged to remove immersion liquid from the immersion space; and
  a droplet removal device arranged to remove a droplet of immersion liquid, wherein:
   the droplet removal device is located further from the optical axis than the fluid removal device, and
   the droplet removal device comprises a porous member which faces the facing surface.

According to an aspect, there is provided an immersion lithographic apparatus comprising: a projection system having an optical axis;
 a substrate table configured to hold a substrate, the substrate, a table, or both, defining a facing surface; and
 a fluid handling structure configured to supply an immersion liquid to an immersion space defined between the projection system and the facing surface, the fluid handling structure comprising:
  a fluid removal device configured to remove immersion liquid from the immersion space; and
  a droplet removal device that faces the facing surface and configured to remove a droplet of immersion liquid, wherein:
   the droplet removal device is located further from the optical axis than the fluid removal device, and
   the distance between at least a portion of the droplet removal device and the facing surface increases with increasing distance from the optical axis.

According to an aspect, there is provided an immersion lithographic apparatus comprising:
 a projection system having an optical axis;
 a substrate table configured to hold a substrate, the substrate, a table, or both, defining a facing surface; and
 a fluid handling structure configured to supply an immersion liquid to an immersion space defined between the projection system and the facing surface, the fluid handling structure comprising:
  a fluid removal device configured to remove immersion liquid from the immersion space; and
  a droplet removal device which faces the facing surface and configured to remove a droplet of immersion liquid, wherein:
   the droplet removal device is arranged to remove a droplet of immersion liquid on the facing surface that has become detached from the immersion liquid in the immersion space by contacting the droplet as the facing surface moves relative to the droplet removal device.

According to an aspect, there is provided a method of manufacturing a device, the method comprising:
 confining immersion fluid in a space defined between a projection system, a facing surface which is defined by a substrate and/or a table, a fluid handling structure, and a meniscus of immersion fluid which extends between the fluid handling structure and the facing surface so as to form a main body of immersion fluid, the projection configured to project a beam of patterned radiation onto an imaging field at a target portion of the substrate and the substrate table configured to hold the substrate;

causing relative motion between the projection system and the substrate and/or substrate table so as to expose different target portions of the substrate; and removing a droplet of immersion liquid formed on the surface of the substrate and/or the substrate table before it re-attaches to the main body of immersion fluid using a droplet removal device, the droplet removal device comprising a porous member which faces the facing surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
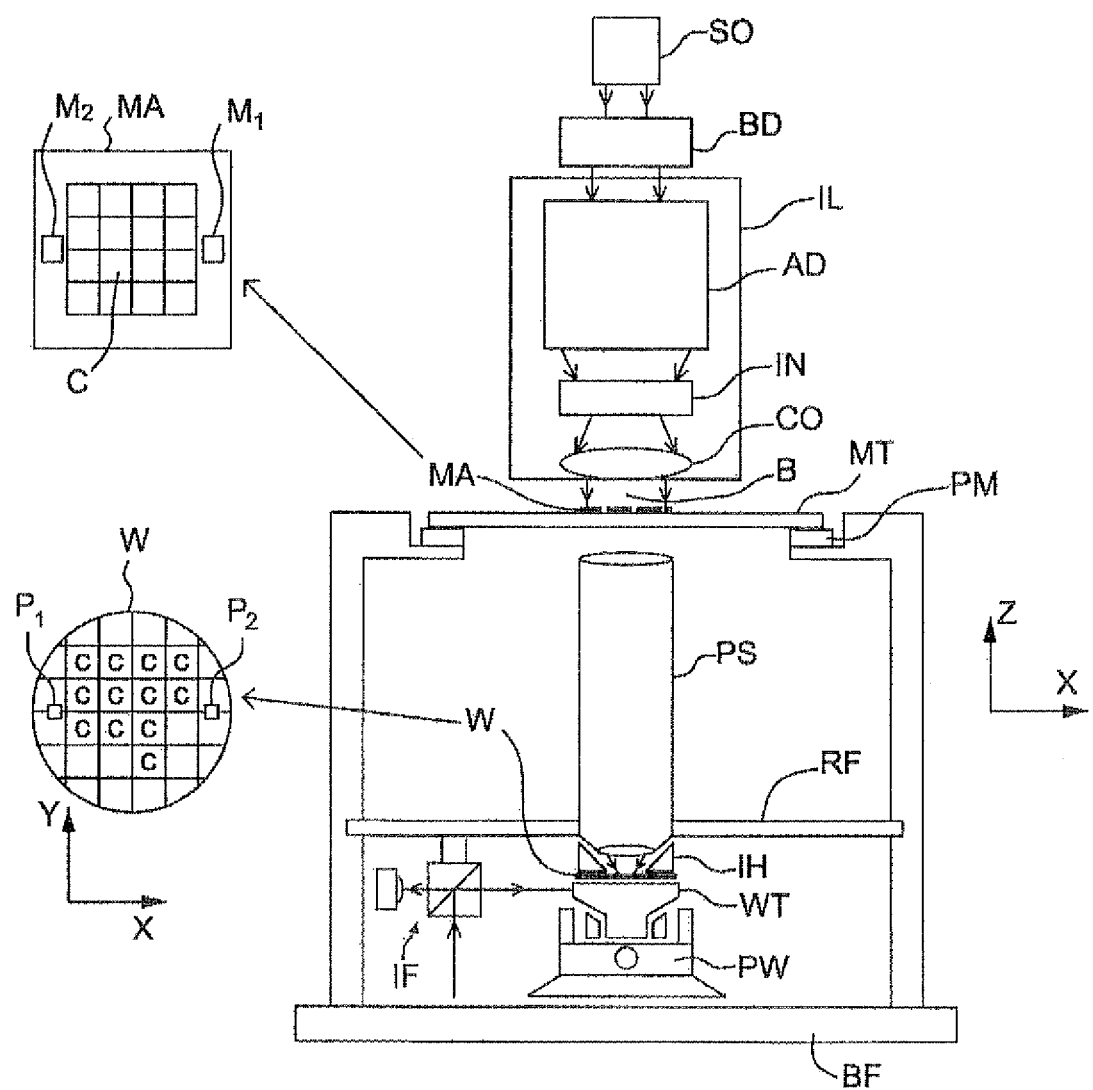
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan, In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the localized immersion system. In the bath type arrangement substantially the whole of the substrate and optionally part of the substrate table is submersed in a bath of liquid. In the so called localized immersion system a liquid supply system is used in which liquid is only provided to a localized area of the substrate. In the localized immersion system, the space filled by liquid is smaller in plan than the top surface of the substrate. The liquid in the space, desirably the liquid in the space which is in contact with the substrate, remains substantially stationary relative to the projection system while the substrate moves underneath the space. The region filled with immersion liquid may be referred to as a localized liquid region.

A further arrangement, to which an embodiment of the present invention is directed, is the all wet immersion system. In an all wet immersion system the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area.

Figure 5:
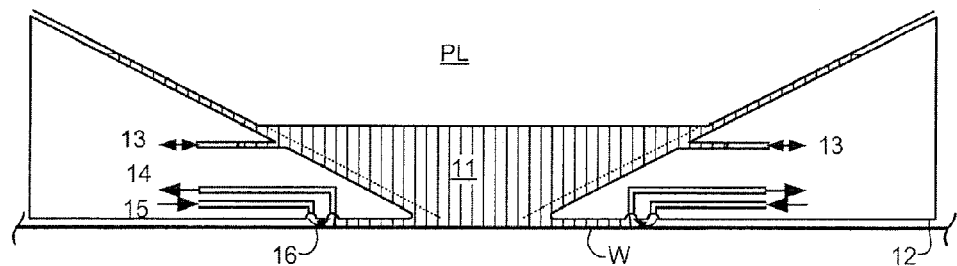
FIG. 5 depicts a liquid confinement structure for use in a lithographic projection apparatus.

Four different types of localized liquid supply systems are illustrated in FIGS. 2-5. The liquid supply systems disclosed in FIGS. 2-4 were described above. Another arrangement which has been proposed is to provide the liquid supply system with a fluid confinement structure. The liquid confinement structure may extend along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). In an embodiment, a seal is formed between the fluid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure or device with a body 12 forming a barrier member or liquid confinement structure, which extends along at least a part of a boundary of the space 11 between the final element of the projection system PS and a facing surface defined by the substrate table WT, substrate W or both. (Please note that reference in the following text to surface of the substrate W also refers in addition or in the alternative to a surface of the substrate table WT, unless expressly stated otherwise. Reference to a facing surface may refer to a surface of the substrate W (and thus the substrate table WT) facing the body of the liquid confinement structure). The fluid handling structure is substantially stationary relative to the projection system PS in the XY plane though there may be some relative movement in the Z direction (in the direction of the optical axis). In an embodiment, a seal is formed between the body 12 and the surface of the substrate W and may be a contactless seal such as a gas seal or fluid seal, or a capillary seal.

The fluid handling device at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet opening 13. The liquid may be removed by liquid outlet opening 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by a seal such as a gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no US 2006-0038968. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 μm. In an embodiment, the porous material is at least slightly liquid-philic (e.g., hydrophilic), i.e. having a contact angle of less than 90° to the immersion liquid, e.g. water.

An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. 2010-0060868, which is hereby incorporated by reference in its entirety.

Figure 2:
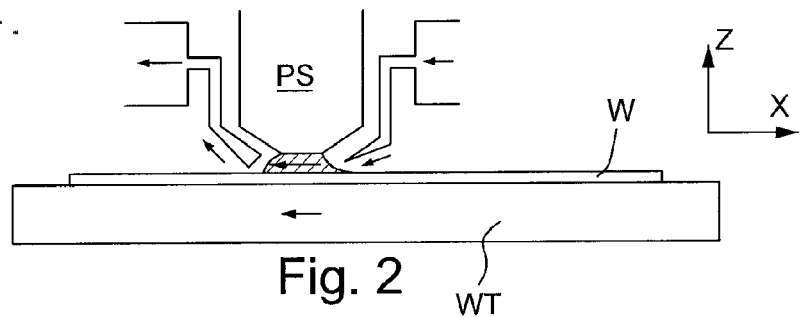
FIGS. 2 and 3 depict a liquid supply system for use in a lithographic projection apparatus.
Figure 3:
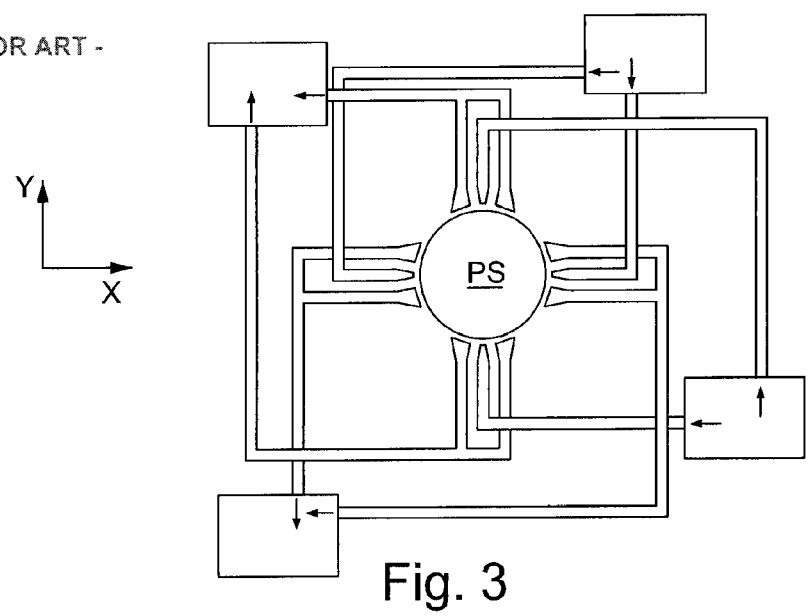
Figure 4:
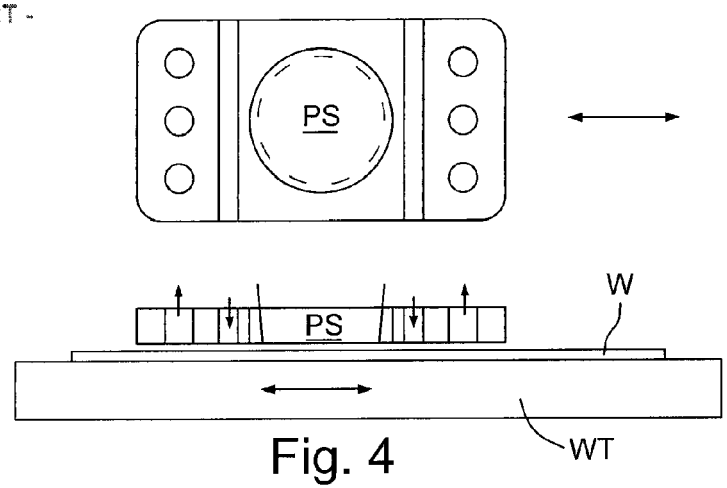
FIG. 4 depicts a liquid supply system for use in a lithographic projection apparatus.

Many types of fluid handling structure are arranged to allow a flow of fluid across the space 11 between the final element of the projection system PS and the substrate W in a certain direction. For example, in a fluid handling system the flow may be achieved by a plurality of openings (e.g. inlets and outlets) which may defined in a surface that surrounds the space 11. The flow may be adjusted by selectively supplying and/or extracting liquid through the openings to create the desired flow. The flow rate may be altered by varying the flow rate through one or more openings. Thus in an embodiment similar to that shown in FIG. 5, the liquid opening 13 may comprise a plurality of openings for the through flow of liquid in the space 11 confined by the body 12. The openings are defined in a surface which may surround the space 11. Liquid can be supplied or removed through the openings to provide a flow in the desired direction, for example across the space 11. The openings through which liquid is supplied the space may be referred to as a set of supply openings. The openings through which liquid may be removed may be referred to as a set of removal openings. As shown in the embodiment of FIGS. 2 and 3, each set of openings may be considered to be a plurality of bodies each of which has a surface in which is defined an opening for the flow of liquid therethrough.

Figure 6:
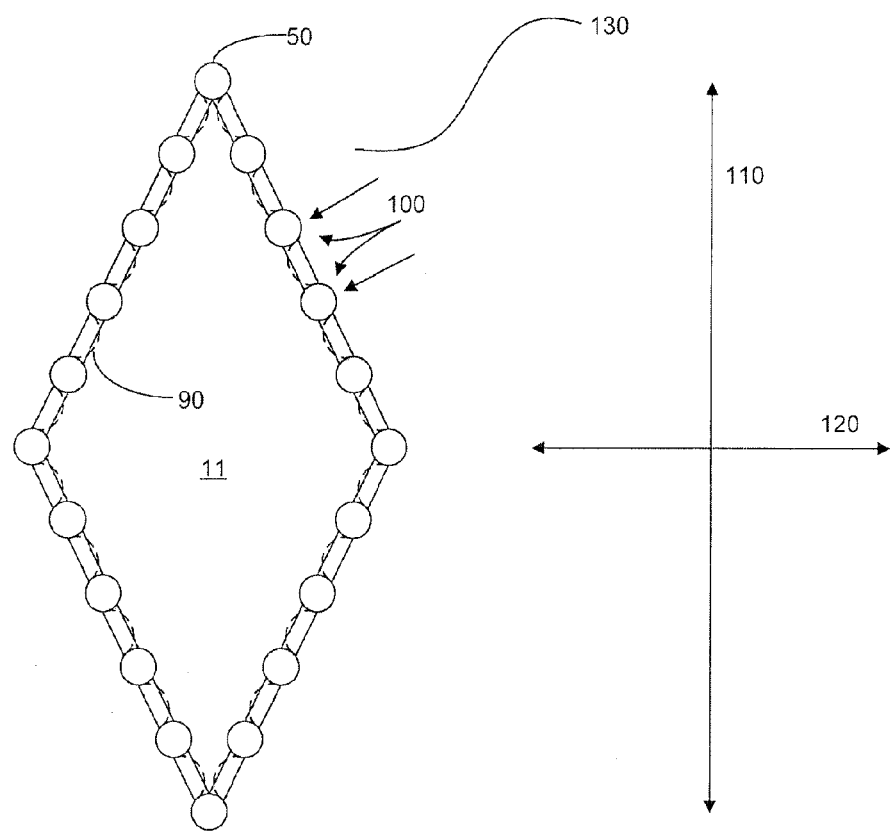
FIG. 6 depicts, in plan, a liquid confinement structure for use in a lithographic projection apparatus, the liquid confinement structure having a plurality of discrete openings.

FIG. 6 illustrates in plan a type of fluid handling structure 130, which is an embodiment that works on a gas drag principle. The so-called gas drag principle has been described, for example, in United States patent application publication no, US 2008-0212046 and United States patent application publication no. US 2009-0279060, both of which are incorporated herein by reference in their entireties. In that system the extraction holes are arranged in a shape in plan which desirably has a corner. The corner may be aligned with the stepping and scanning directions. The shape of the arrangement reduces the force on the meniscus between two openings in the surface of the fluid handing structure for a given speed in the step or scan direction compared to if the two outlets were aligned perpendicular to the direction of scan.

In use the fluid handling structure may function as a seal and may be used, for example, in place of the seal 14, 15, 16 as described in reference to an embodiment as shown in FIG. 5. The seal shown in FIG. 6 functions as a meniscus pinning device. The liquid may be confined in the space 11 (also referred to as an immersion space 11) by the device. The device comprises a plurality of discrete openings 50. The openings 50 may function as outlets 50 with respect to immersion liquid confined by the device, for example in the space 11. The openings 50 are illustrated as being circular though this is not necessarily the case. An outlet 50 may be, for example, square, rectilinear, for example rectangular, triangular, or rhomboidal or an elongate slit.

Each of the openings 50 of the meniscus pinning device of FIG. 6 may be connected to a separate under pressure source. Alternatively each opening 50 may be connected to a common chamber (which may be annular). The chamber may be held at an under pressure. In this way a uniform under pressure at each outlet can be achieved. The opening 50 may be an outlet of a tube or elongate passageway 55, for example. Desirably the opening is positioned such that it faces the substrate. In an embodiment the openings 50 may be defined in a surface, for example an undersurface of a liquid confinement structure.

Each opening 50 is designed to extract a mixture of liquid and gas, i.e. a two phase fluid. The liquid is extracted from the space 11 whereas the gas (e.g., air) is extracted from the atmosphere on the other side of the openings 50 to the liquid. The extraction of the gas creates a gas flow as illustrated by arrows 100. The gas flow is effective to pin the meniscus 90 between the openings 50 in place as illustrated in FIG. 6.

As can be seen from FIG. 6, the openings 50 may be positioned so as to form, in plan, a polygonal shape. In the case of FIG. 6 this is in the shape of a rhombus with the principal axes 110, 120 aligned with the major directions of travel of the substrate W under the projection system. The openings 50 may be arranged so as to form any suitable shape, such as a circle, or a star, for example a four-pointed star.

Figure 7:
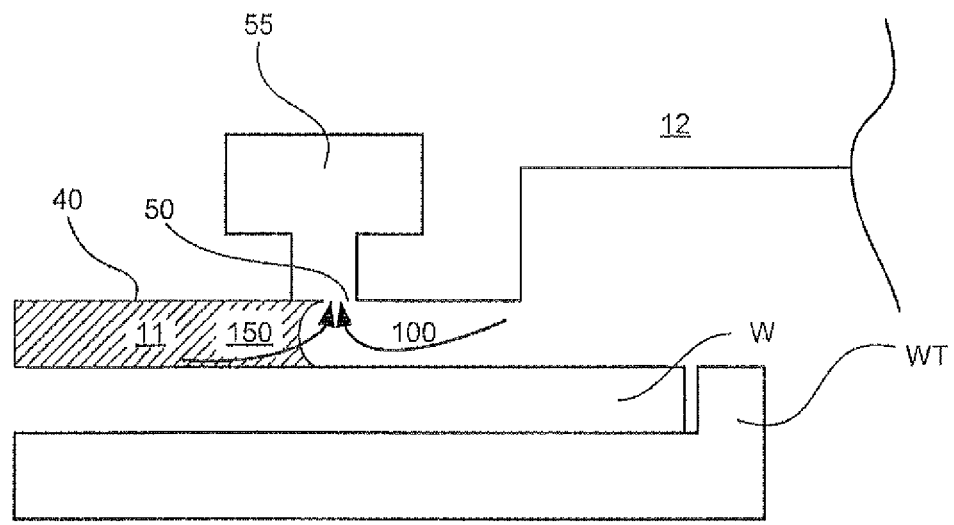
FIG. 7 depicts a cross-section through one of the discrete openings of the liquid supply system shown in FIG. 6.

The openings 50 may be provided in a protrusion from the bottom surface 40 of the liquid confinement structure 12. This is however not necessarily the case and the openings 50 may be defined in the major bottom surface of the liquid confinement structure 12 as shown in FIG. 7. In this case the liquid will abut the major bottom surface and thereby not have a free top surface which is prone to the undesirable generation of waves.

As mentioned with reference to FIG. 7, arrow 100 shows the flow of gas from outside of the liquid confinement structure 12 into the passageway 55 associated with the outlet 50. Arrow 150 illustrates the passage of liquid from the space 11 into the outlet 50. The passageway 55 and outlet 50 are designed so that two phase extraction (i.e. gas and liquid) occurs. The two-phase flow may be annular. This means that the gas flows through the center of the passageway 55 and liquid flows along the walls of the passageway 55. This would result in smooth flow without the generation of pulsations.

The level of liquid in the space 11 may be arranged such that it does not touch the bottom surface 40 of the liquid confinement structure 12 even radially inwardly of the openings 50. However this is not necessarily the case, as in the example shown in FIG. 7. The radially innermost meniscus pinning feature may be the openings 50. The openings 50 may be the radially outwardmost component or meniscus pinning feature. Thus, in such an embodiment, in comparison to the liquid supply system of FIG. 5, there may be no gas inlet 15 or equivalent. The outlet 14 is present as a plurality of discrete openings 50 each connected to an under pressure source. The meniscus is pinned between the openings 50 with drag forces induced by gas flow into the openings 50, which may act as outlets 50 in operation. A gas (e.g., air) drag velocity of greater than about 15 m/s, desirably 20 m/s, is sufficient. By avoiding the need for a gas knife as is present in other liquid confinement systems, the amount of evaporation of liquid from the substrate may be reduced thereby reducing both splashing of liquid as well as thermal expansion/contraction effects. In an embodiment the features of a gas knife may be radially outward of the openings 50, for example as gas knife openings for the passage of gas, the gas knife openings defined in the undersurface 40 of a liquid confinement structure 12. The gas flow through the openings may serve to assist the confinement of the liquid in the space and the pinning of the liquid between the openings 50.

By way of example only, 36 discrete outlets each with a diameter of 1 mm and separated by 3.9 mm may be effective to pin a meniscus. The total gas flow in such a system is on the order of 100 l/min.

During operation of the immersion lithographic apparatus, immersion liquid may escape from the space 11. This may happen regardless of the type of liquid supply system that is used. Thus, for example, droplets of immersion liquid may escape from the space 11 when the meniscus pinning device shown in FIGS. 6 and 7 is used.

A droplet may form on a surface, for example, after a localized liquid region has passed over the surface. A droplet may form of the surface of a substrate, for example, when the substrate is removed from a substrate table, for example after exposure. A way in which a droplet of immersion fluid may be formed is, for example, when a meniscus of immersion liquid between a liquid confinement structure and a facing surface of a substrate crosses the peripheral edge of the substrate. On crossing the peripheral edge the meniscus becomes unstable, causing a droplet to form. The droplet may form on the surface of the substrate or on the substrate table depending on, for example, the scanning direction.

During subsequent relative movement between the liquid confinement structure and a facing surface such as the substrate and/or substrate table, the unwanted droplet of immersion liquid may collide with a meniscus between the liquid confinement structure and the facing surface. The meniscus may be the meniscus of a main body of immersion liquid confined by a liquid confinement structure. The collision can result in the formation of a bubble within the main body of immersion liquid. Such a bubble may move through the immersion liquid, for example into the path of an exposing beam of radiation. The bubble may interfere with the exposing beam. The bubble may be a source of a defect present on the exposed substrate. The risk of collision between a droplet on the facing surface and the meniscus may increase after a change of direction of relative motion between the facing surface and the liquid confinement structure. This may occur, for example, when the scanning direction is changed, during a stepping motion, or on movement to new target portion of the substrate for exposure.

Despite the above described arrangements to confine the liquid, small amounts of liquid may thus escape from the space 11 at any time, for example when the liquid confinement structure 12 (and the immersion liquid it confines) crosses the edge of the substrate W. If immersion liquid escapes from the space 11, then a droplet may formed on the surface of the substrate W and/or on the surface of the substrate table WT.

Figure 8:
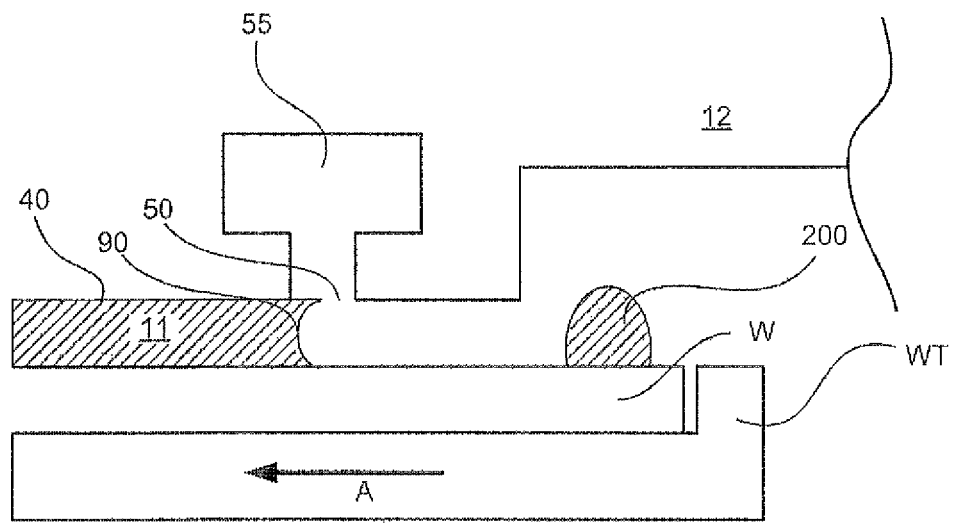
FIG. 8 depicts the liquid confinement structure shown in FIG. 7 with an unwanted immersion liquid droplet present on the substrate.

In the example shown in FIG. 8, immersion liquid has escaped from the space 11 so as to form a droplet 200 of immersion liquid on the surface of the substrate W. If the droplet 200 is not removed from the surface of the substrate W, it could have a negative impact on the accuracy of the exposure of the substrate. This can be due to the droplet contacting the main body of immersion liquid in the immersion space 11, as explained below.

Arrow A in FIG. 8 illustrates the direction of movement of the substrate W and substrate table WT relative to the space 11. The movement is towards the immersion liquid in space 11 (which may hereinafter be referred to as the main body of liquid). The droplet 200 moves with the substrate W. If the droplet 200 is not removed from the surface of the substrate W, it moves with the substrate W towards the space 11.

Figure 9:
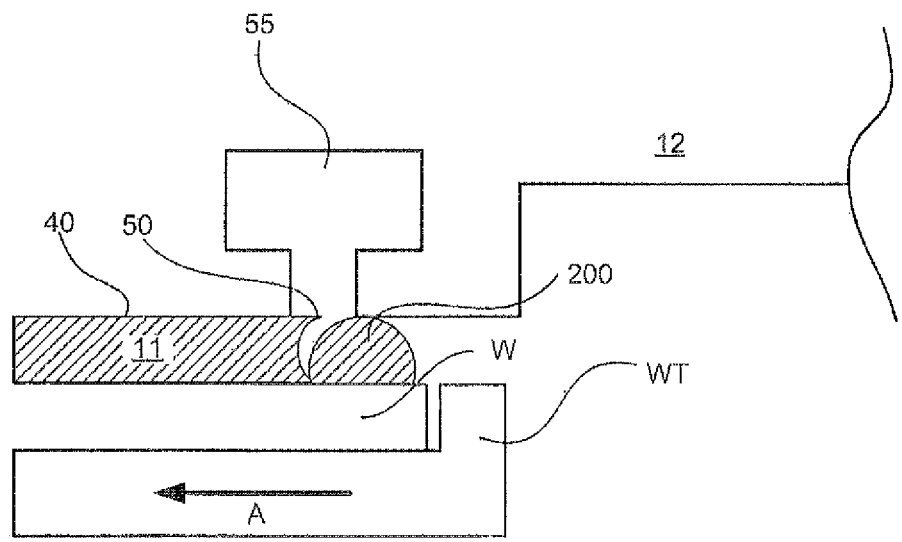
FIG. 9 depicts the liquid droplet shown in FIG. 8 interacting with a main body of immersion liquid.

As shown in FIG. 9, once the substrate W and substrate table WT have moved sufficiently far in the direction of arrow A relative to the immersion space 11, the droplet 200 comes into contact with the immersion liquid in the space 11. The droplet 200 may contact the meniscus 90 of the immersion liquid of the main body. The meniscus 90 is formed between the substrate W and the opening 50. As the substrate table (and so substrate W) moves with a relatively high velocity relative to the liquid confinement structure 12, the moment of contact between the meniscus and the droplet 200 is a collision.

Figure 10:
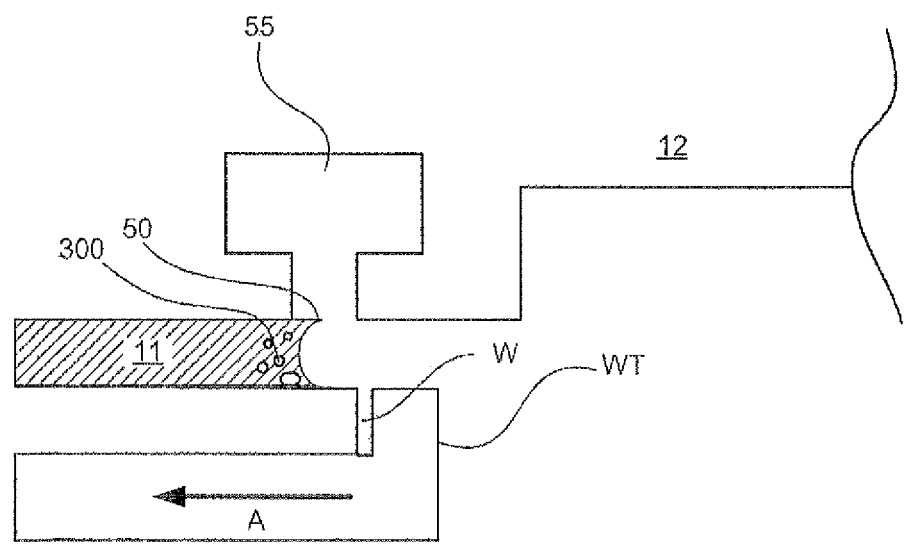
FIG. 10 depicts the formation of bubbles in the immersion liquid contained in an immersion space due to interaction with an immersion liquid droplet.

FIG. 10 shows the situation when the substrate W and substrate table WT continue to move further in the direction of arrow A from the position shown in FIG. 9. As can be seen in FIG. 10, the droplet of immersion liquid 200 may contact the main body of immersion fluid contained in space 11, but this is not necessarily the case. Some of the liquid may scatter to form further droplets. However, upon contact a gas bubble 300, for example one or more air bubbles, may form in the immersion liquid in the immersion space 11. The bubble 300 may move through the immersion space, so that it may be in the path of an exposure beam. During subsequent exposure of the substrate, the exposing beam of radiation may then pass through the gas bubble 300. Passing of radiation through the gas bubble affects the properties of the exposing radiation beam, for example the beam may become attenuated, thereby reducing the accuracy and reproducibility of the exposure. In this way a droplet may increase the defectivity caused during exposure.

As will be understood from the above description relating to FIGS. 8-10, it is desirable to be able to remove any droplet 200 of immersion liquid that has escaped from the space 11 before it contacts and/or interacts with the main body of immersion liquid in the immersion space 11. According to an embodiment, a droplet removal device 400 is provided to remove any immersion liquid droplet 200 before contact with the immersion liquid in space 11, especially the meniscus 90.

Figure 11:
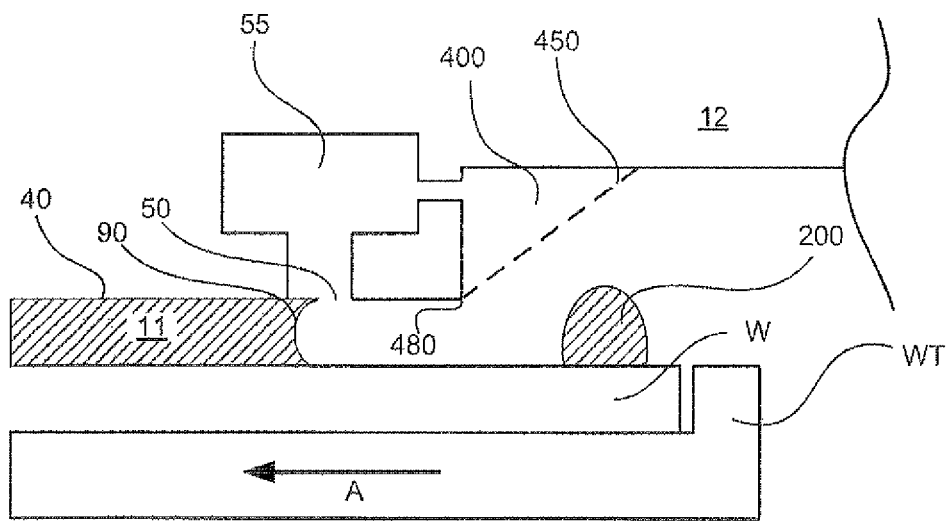
FIG. 11 depicts a liquid confinement structure comprising a droplet removal device according to the present invention.

FIG. 11 shows part of a fluid handling structure including a droplet removal device 400 according to an embodiment of the invention. A droplet removal device 400 includes a porous member 450. The droplet removal device 400 is configured to remove an immersion liquid droplet 200 before contact, e.g. recombination, with the main body of the immersion liquid in space 11. In an embodiment, the droplet removal device 400 is arranged substantially to face the upper surface of the facing surface, e.g. a substrate W (i.e. the surface being exposed). The porous member 450 typically has openings through which immersion liquid forming the immersion liquid droplet 200 can be drawn. The openings may be formed in a plate. The thickness of the plate may be selected from the range of, for example, 10 μm to 200 μm, or 25 μm to 100 μm. For example, in an embodiment, the thickness of the plate is approximately 50 μm.

In an embodiment, the droplet removal device 400 is a two-phase removal device which may also remove gas from the space surrounding the escaped droplet 200. The porous member of the droplet removal device 400 may be referred to as a microsieve.

In an embodiment, at least a portion of the porous member 450 is angled. The surface of the porous member may be angled such that its distance from the facing surface, e.g. the surface of the substrate W, increases with increasing distance from the immersion space 11. The distance between the porous member and the substrate W is arranged to increase with increasing distance from the optical axis of the projection system PS over at least a portion of the porous member. In the embodiment shown in FIG. 11, the distance between the porous member and the substrate W is shown as increasing with increasing distance from the optical axis of the projection system PS along the entire extent of the porous member.

Figure 12:
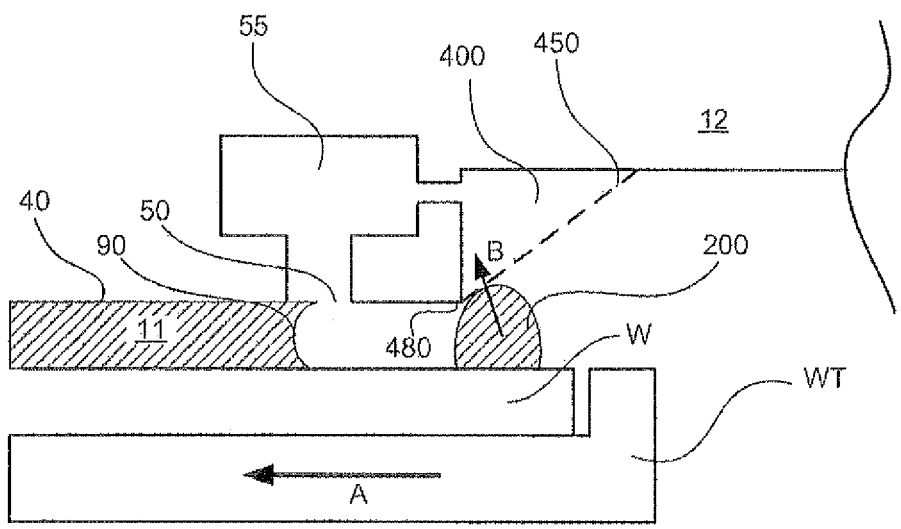
FIG. 12 depicts the liquid confinement structure comprising the droplet removal device shown in FIG. 11, with the removal of a droplet through the droplet removal device.

As can be seen in the arrangement shown in FIG. 12, when the substrate W and substrate table WT move in the direction of arrow A (i.e. the edge of the substrate W illustrated in FIG. 12 moves towards the immersion space 11), the immersion liquid droplet 200 moves towards the droplet removal device 400. When the droplet 200 reaches approximately the position shown in FIG. 12 relative to the droplet removal device 400 it starts to be removed by the droplet removal device 400. At this position, the droplet 200 contacts the droplet removal device 400. The part of the droplet removal device 400 which contacts the droplet in use is at least a distance from the facing surface (the surface of the substrate W) which is the height of the droplet. In an embodiment, the droplet 200 is removed through the openings in the porous member 450 of the droplet removal device 400, for example in the direction shown by arrow B in FIG. 12.

Typically the openings of porous member 450 form holes through which the immersion liquid droplet 200 is removed. These holes can take any suitable form. For example, they may be square, rectangular, triangular, circular, or any other appropriate shape. For example, the openings in the porous member of the droplet removal device 400 may be circular holes.

The openings of porous member 450 may have a diameter selected from the range of 5 μm to 100 μm. In an embodiment, the openings may be circular holes. The holes may have a diameter selected from the range of 10 μm to 50 μm. The holes may have a diameter of approximately 20 μm. The values given above for the diameter of openings may also apply to the major dimensions of openings of other shapes, such as square, rectangular or triangular holes. The precise area of the openings and the space in between the openings may be set so as to provide sufficient suction to remove a droplet 200 selected from a range of possible sizes that may form on the surface of the substrate W.

In an embodiment, such as that shown in FIGS. 11 and 12, the spacing of the openings of the porous member 450 in the droplet removal device 400 may be even. Furthermore, the area and shape of the openings themselves may be uniform across the droplet removal device 400. However, in alternative embodiments, the size and/or shape of the openings, and/or the gap between the openings may vary across the droplet removal device 400.

Figure 15:
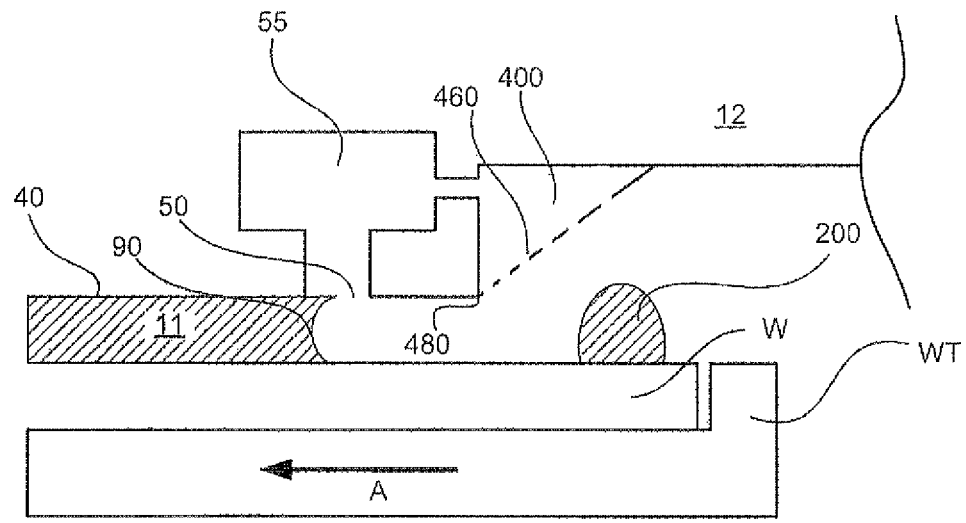
FIG. 15 depicts a liquid confinement structure including a further droplet removal device according to the present invention.

For example, in an embodiment, such as that shown in FIG. 15, the droplet removal device 400 may comprise a porous member 460. The spacing between the openings defined in the porous member 460 may increase with increasing distance from the optical axis of the projection system PS of the immersion lithographic apparatus. In an embodiment, the spacing between the openings of the porous member 460 may increase with increasing distance from the outlet 50 of the fluid handling system. The variation may occur continuously, or be arranged in two or more bands in which the cross-sectional area of the openings, the spacing between the openings (i.e. opening density) or both are substantially uniform. The properties of the bands may change with increasing distance from the opening 50 and/or the optical axis of the projection system. In reference to the embodiments described below, they may each occur as a continuous variation or as a series of two more bands each with uniform properties.

In an embodiment, such as that of FIG. 15, the spacing, or gap, between the openings of the porous member may increase with increasing distance between the facing surface, e.g. substrate W, and the droplet removal device 400.

In an embodiment, the size of the openings (i.e. the area of each opening) of the porous member of the droplet removal device 400 may, additionally or alternatively, change with increasing distance of the porous member of the droplet removal device 400 from the facing surface, e.g. substrate W. In an embodiment, the area of each opening may decrease with increasing distance between the substrate W and the droplet removal device 400. In an embodiment, the area of each opening may decrease with increasing distance from the optical axis of the immersion lithographic apparatus. In an embodiment, the area of each opening may decrease with increasing distance from an opening 50 of the fluid handling system.

The spacing between the openings of the porous member of the droplet removal device 400 and/or the outlet area of the openings may vary as described above with increasing distance from the facing surface, e.g. substrate W due to the differing sizes of a droplet 200 that will be removed at the different heights (i.e. heights above the substrate W) of the droplet removal device 400. Thus, for example, a larger droplet may be removed through openings on the porous member located at a position that is further away from the substrate W than a droplet that is removed through openings that are located on the porous member closer to the substrate W. A larger droplet will extend over a greater area of the droplet removal device 400. This means that the spacing between the openings can be increased when removing such a larger droplet while still ensuring that a larger droplet 200 covers at least one opening (or at least two, three, four, five, six, or more openings) when it contacts the droplet removal device 400. Similarly, the outlet area of the openings of the porous member can be decreased while still ensuring that a sufficient area of openings is presented to the larger droplet 200 for removal of the droplet.

In an embodiment, the distance between the droplet removal device 400 and the facing surface (e.g., the substrate W and/or substrate table WT) that faces the droplet removal device 400 increases with increasing distance from the optical axis of the lithographic apparatus. In some embodiments, the distance between the droplet removal device 400 and the substrate W increases with increasing distance from the optical axis of the immersion lithographic apparatus across the entire extent, or width of the droplet removal device 400. Such an embodiment is explained in relation to FIGS. 11 and 12.

In other embodiments, the distance between the droplet removal device 400 and the facing surface, e.g. substrate W, does not increase with increasing distance from the optical axis of the immersion lithographic apparatus across the entire extent of the droplet removal device 400. For example, in an embodiment such as those shown in FIGS. 13 and 14, the distance between the droplet removal device 400 and the facing surface, e.g. substrate W, only increases with increasing distance from the optical axis of the immersion lithographic apparatus across a portion of the droplet removal device 400.

Figure 13:
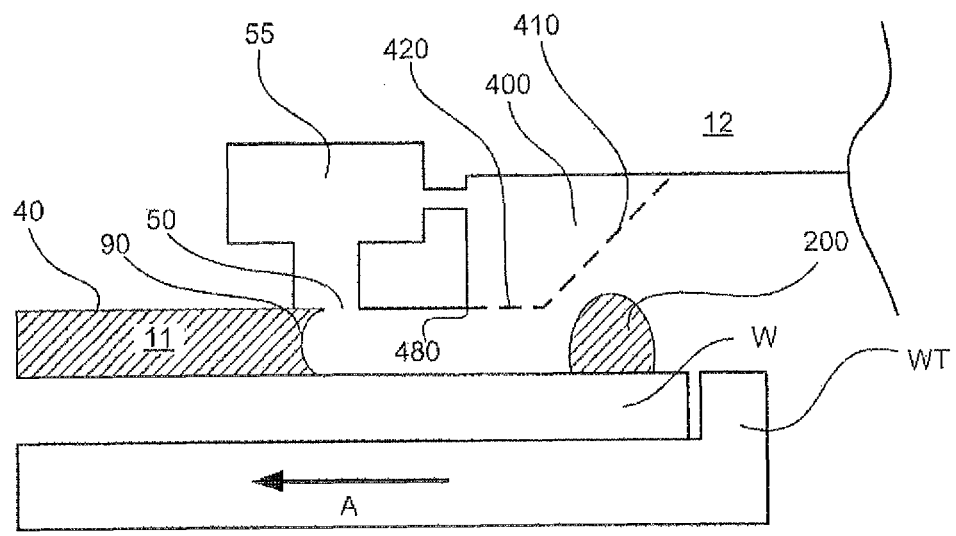
FIG. 13 depicts a liquid confinement structure including a further droplet removal device according to the present invention.
Figure 14:
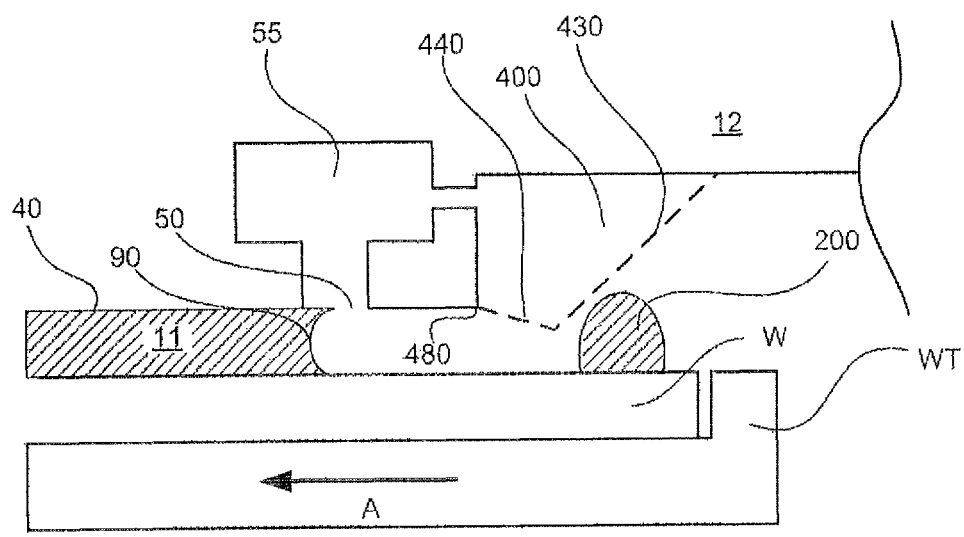
FIG. 14 depicts a liquid confinement structure including a further droplet removal device according to the present invention.

In an embodiment, such as that shown in FIGS. 13 and 14, the distance between the droplet removal device 400 and the facing surface, e.g. substrate W, increases with increasing distance from the optical axis of the immersion lithographic apparatus only for an outer portion of the droplet removal device 400, i.e. for a portion of the droplet removal device 400 that is further away of the optical axis of the immersion lithographic apparatus than the rest of the droplet removal device 400. For example, the portion 410 in FIG. 13 or the portion 430 of FIG. 14 over which the distance between the droplet removal device 400 and the substrate W increases with increasing distance from the optical axis of the immersion lithographic apparatus may be between from the outer 10% (or less than 10%) to the outer 90% (or more than 90%) of the droplet removal device 400 with respect to the optical axis of the immersion lithographic apparatus. For example, the portion 410 or portion 430 may be the outer 20%, 30%, 40%, 50%, 60%, 70%, or 80% of the droplet removal device 400 with respect to the optical axis.

In an embodiment such as shown in FIG. 13 or FIG. 14, the distance between the droplet removal device 400 and the substrate W increases across a portion of the entire extent of the droplet removal device 400 with respect to the optical axis (and not its entire extent). The inner portion 420 may be at a substantially constant distance from the facing surface, e.g. the substrate W. Such an embodiment is shown in FIG. 13. The distance between the inner portion 440 of the droplet removal device 400 and the facing surface, e.g. the substrate W, may decrease with increasing distance from the optical axis. Such an embodiment is shown in FIG. 14. In the embodiment shown in FIG. 14, the minimum distance between the droplet removal device 400 and the substrate W may be less than in the embodiment shown in FIG. 13. This is because the inner portion 440 of the droplet removal device 400 may approach the facing surface, e.g. the substrate W, with increasing distance from the optical axis. This may provide an advantage that a smaller droplet 200 may be removed through the droplet removal device 400.

In the embodiments shown in FIGS. 11-16, the inner edge 480 of the droplet removal device 400 with respect to the optical axis of the immersion lithographic apparatus is the same distance from the facing surface as the distance from the undersurface 40 of the liquid confinement structure 12 to the facing surface, for example the portion of the undersurface 40 closest the facing surface. However, in an embodiment, the distance between the facing surface and the droplet removal device 400 at the inner edge 480 (with respect to the optical axis) of the droplet removal device 400 may be different, for example less than, the distance between the facing surface and the undersurface 40 of the liquid confinement structure 12 (or another part of the liquid confinement structure 12 if the droplet removal device is part of the liquid confinement structure 12). This may allow a smaller droplet 200 to be recovered through the droplet removal device 400 before it contacts the main body of immersion liquid in the immersion space 11.

The distance between the droplet removal device 400 and the facing surface may be selected from the range of 50 μm to 500 μm. The distance between the droplet removal device 400 and the facing surface may be selected from the range of 75 μm to 300 μm or the range of 100 μm to 200 μm. For example, in an embodiment, a distance between the facing surface and the droplet removal device 400 is approximately 150 μm or 160 μm or 170 μm or 180 μm. These values may represent the shortest distance between the droplet removal device 400 and the facing surface, or if the droplet removal device is part of the liquid confinement structure 12, the shortest distance between the liquid confinement structure 12 and the facing surface. Alternatively, these values may represent the average distance between the facing surface and the droplet removal device 400.

In plan form, the shape of the droplet removal device 400 may correspond or be similar to the shape formed by the openings 50 of the fluid handling structure 130 used to contain the main body of the immersion liquid in the immersion space 11. For example, this may mean that the shape of the droplet removal device 400 in plan corresponds to the actual shape of the liquid outlet. It may additionally or alternatively mean that it corresponds to the shape of the meniscus 90 (in plan view) of the immersion liquid. As such, the liquid openings 50 of the fluid handling structure (and/or the meniscus 90 of the immersion liquid formed by the outlets) may have the same shape in plan view as the droplet removal device 400. However, they may be of different sizes.

In an embodiment, the plan form shape formed by liquid openings 50 (and/or the meniscus of the immersion liquid formed by the openings 50) and the droplet removal device 400 may both have an annular shape. In another embodiment, the plan form shape formed by liquid openings 50 (and/or the meniscus of the immersion liquid formed by the openings 50) and the droplet removal device 400 may both have at least four sides. For example, they may both form a four-pointed star, or take a substantially diamond shape.

The shape of the droplet removal device 400 in cross-section (i.e. in the views shown in FIG. 11-16) may be unrelated to the shape of the droplet removal device 400 in plan view. As such, any combination of cross-sectional, plan and opening distribution/size arrangements discussed herein may be combined with each other in different embodiments of the invention.

In an embodiment the droplet removal device 400 may be located only near one or more parts of the shape defined in plan by the openings 50. One such part is a corner of the shape. The droplet removal device 400 may be located at a position associated with each corner of the shape. The corners are aligned with the desired scanning and/or stepping directions. While the facing surface is moving relative to the liquid confinement structure, the droplet removal device 400 may remove droplets from the facing surface at the trailing corner with respect to the relative direction of movement (e.g. in the scanning or stepping direction). The droplet removal device 400 may remove droplets at an advancing corner, so a droplet approaching the main body of immersion liquid but before the droplet contacts the advancing meniscus 90 between the liquid confinement structure and the facing surface.

The plan form shape formed by the openings 50 of the liquid confinement structure (or the meniscus 90 formed by the openings 50 of the fluid handling structure) may have different dimensions to the droplet removal device 400 in plan view. In an embodiment of the invention, the droplet removal device 400 is located outside of or at a greater radius than, the openings 50 of the liquid confinement structure with respect to the optical axis of the immersion lithographic apparatus. In an embodiment, the distance between the outer edge (with respect to the optical axis) of the openings 50 (or the meniscus 90 of the immersion liquid in the space 11 formed by the openings 50) and the inner edge 480 (with respect to the optical axis) of the droplet removal device 400 may be selected from the range of 0.1 mm to 10 mm. In an embodiment, this distance may be selected from the range of 0.5 mm to 5 mm. In an embodiment, this distance may be 2.5 mm. This distance may be referred to as the radial width. In an embodiment, this distance may be substantially constant around the extent of the droplet removal device, or constant in desired directions, such as the scanning and/or stepping direction. Alternatively, the distances given above may represent average values around the periphery or in desired directions, such as the scanning or stepping directions. In an embodiment, the radial width of the droplet removal device 400 in plan may be greater in one of the desired directions (i.e. scanning or stepping directions) than the other.

In an embodiment, target portions are scanned in series, along a line across the surface of the substrate W. The scanning motion is perpendicular to the line, so that the substrate W and substrate table WT is stepped between scanning each target portion. In an embodiment, in a direction perpendicular to the scanning direction, the radial width of the droplet removal device 400 is dimensioned to extend over one or more target portions. Thus as each new target portion is scanned, the droplet removal device 400 passes over a target portion which has recently been exposed, removing liquid from the surface of the target portion. Thus the liquid droplets may be removed before the liquid evaporates and before the droplet may interact with the meniscus of the main body of immersion liquid in the space 11.

In an embodiment, the radial width of the droplet removal device 400 may be sized so that at the end of scanning a target portion, a portion which may be substantially the entire portion of a target portion, or more than one target portion, may be covered by the droplet removal device. In this arrangement, any liquid remaining on a target portion after scanning, i.e. after exposure, or which may be present prior to scanning and so prior to exposure, is removed.

Increasing the radial width of the droplet removal device 400 in one or more of these ways may enable larger relative velocities, e.g. scanning and/or stepping speeds, between the projection system and the facing surface to be achieved with less concern to the stability of the meniscus. The chance that a liquid droplet remains after passing under the droplet removal device 400 thus may be reduced.

Figure 17:
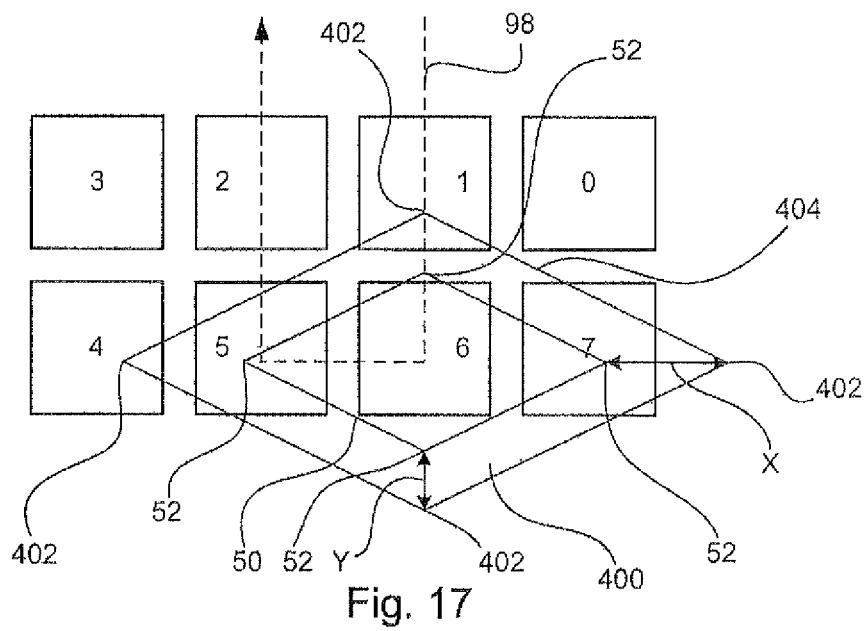
FIG. 17 depicts a plan view of a path taken by a liquid confinement structure including a droplet removal device according to an embodiment of the invention relative to a substrate.

FIG. 17 shows an embodiment in which the droplet removal device 400 extends around the immersion space 11 created by the openings 50. Eight target portions (0-7) are shown in FIG. 17. The path 98 indicates the motion of the substrate W relative to the immersion space 11 (for example the center of the immersion space 11) during exposure of target portions 1 and 2. In this embodiment, the radial width X of the droplet removal device 400 in the stepping direction (i.e. the direction from target portion 1 to target portion 2) is greater than the radial width Y in the scanning direction.

Figure 18:
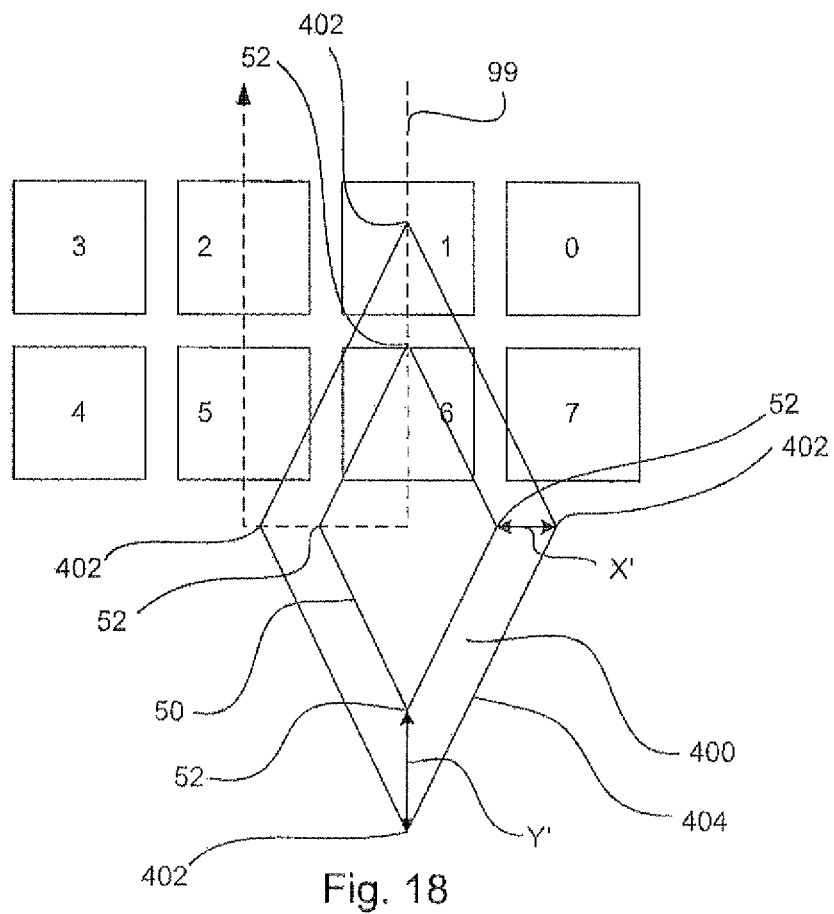
FIG. 18 depicts a plan view of a path taken by an alternative liquid confinement structure including a droplet removal device according to an embodiment of the invention relative to a substrate.

FIG. 18 shows a similar arrangement to that of FIG. 17, but in this case the radial width X' of the droplet removal device 400 in the stepping direction is less than the radial width Y' of the droplet removal device 400 in the scanning direction. As a result, the relative path 99 taken by the substrate W to move from exposing target portion 1 to exposing target portion 2 in the embodiment of FIG. 18 is different (i.e. extends further in the scanning direction) to the path 98 taken in the embodiment of FIG. 17.

In the embodiments shown in FIGS. 17 and 18, the surface of the droplet removal device 400 is angled away from the facing surface with increasing distance from the line of openings 50. In an embodiment, the surface of the droplet removal device 400 has at least a portion which is substantially parallel to the facing surface. The whole surface may be parallel to the facing surface. In an embodiment at least a portion of the surface (even the whole surface) of the droplet removal device 400 is angled towards the facing surface with increasing distance from the line of openings 50.

In the embodiments shown in FIGS. 17 and 18, the angles of the corners 402 defined by an outer edge 404 of the droplet removal device are similar to the angles of the corners 52 defined by the line of openings 50. In an embodiment, the angles of the corners 52 of the line of openings 50 aligned with the scanning direction, stepping direction or both are different from the angles of the corners 402 of the outer edge 404 of the droplet removal device 400.

In a variation of the embodiment shown in FIG. 17, the angles of the corners 52 of the line of openings 50 aligned with the scanning direction is smaller than the angles of the corners 402 of the outer edge 404 of the droplet removal device 400. The corners 52 defined by the line of openings 50 may be 90 degrees or may be acute, between 90 and 75 degrees or less than 80 degrees. The angles of the corners 52 of the line of openings 50 aligned with the stepping direction may be larger than the angles of the corners 402 of the outer edge 404 of the droplet removal device 400. The angle of the corners 52 of the line of openings 50 may be 90 degrees, or obtuse i.e. more than 90 degrees, for example between 90 and 105 degrees or more than 105 degrees.

In a variation of the embodiment shown in FIG. 18, the angles of the corners 52 of the line of openings 50 aligned with the stepping direction are smaller than the angles of the corners 402 of the outer edge 404 of the droplet removal device 400. The corners 52 defined between the line of openings 50 may be substantially 90 degrees, or obtuse for example between 90 and 105 degrees. The angles of the corners 52 of the line of openings 50 aligned with the scanning direction may be larger than the angles of the corners 402 of the outer edge 404 of the droplet removal device 400. The angle of the corners 52 of the line of openings 50 may be substantially 90 degrees or acute, desirably between 75 and 90 degrees.

In the embodiments shown in FIGS. 11-15, the porous member of the droplet removal device 400 is shown as being connected to the same passageway 55 as the openings 50 of the fluid handling structure. This means that the openings 50 and the droplet removal device 400 may be connected to the same under pressure source, e.g. suction device, for providing extraction of the main body of immersion liquid and the droplets 200 respectively. The suction device may be, for example, a pump.

Figure 16:
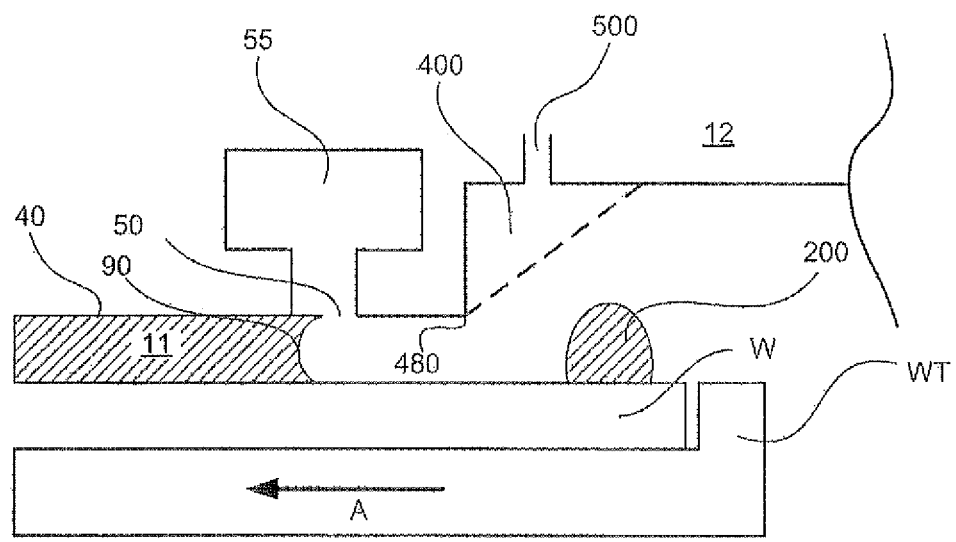
FIG. 16 depicts a liquid confinement structure including a further droplet removal device according to the present invention.

In an embodiment, such as that shown in FIG. 16, the porous member of the droplet removal device 400 may be connected to its own under pressure source, e.g. suction device (not shown), via passageway 500. In this embodiment, the openings 50 of the liquid confinement structure are connected to a different suction device via passageway 55 than to which the droplet removal device 400 is connected. As such, the suction provided to the droplet removal device 400 via passageway 500 may be different to the suction provided to the openings 50 via the passageway 55. The suction device connected to both passageways 55 and 500 may each be a pump. The pumps may be different.

The above description has been provided in relation to an immersion lithographic apparatus. However, the droplet removal device 400 described herein may be provided as a separate entity to be added on to an existing fluid handling system or liquid confinement structure. Alternatively still, the droplet removal device 400 described herein may be provided as part of a fluid handling system or liquid confinement structure. The fluid handling system or liquid confinement structure may subsequently be incorporated into an immersion lithographic apparatus or another apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described herein may each or in combination be operable when one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

In an embodiment there is provided an immersion lithographic apparatus comprising a projection system having an optical axis, a substrate table and a fluid handling structure. The substrate table is configured hold a substrate. The substrate, a table, or both, defines a facing surface. The fluid handling structure is configured to supply an immersion liquid to an immersion space defined between the projection system and the facing surface. The fluid handling structure comprises a fluid removal device and a droplet removal device. The fluid removal device is arranged to remove immersion liquid from the immersion space. The droplet removal device is arranged to remove a droplet of immersion liquid and is located further from the optical axis than the fluid removal device. The droplet removal device comprises a porous member which faces the facing surface.

The distance between at least a portion of the porous member and the facing surface may increase with increasing distance from the optical axis. The portion may be provide at an outer portion of the porous member with respect to the optical axis.

The immersion lithographic apparatus may have an inner portion of the porous member, which is located closer to the optical axis than said portion. The inner portion may be at a substantially constant distance from the facing surface.

The distance between an inner portion of the porous member, which is located closer to the optical axis than said portion, and the facing surface may decrease with increasing distance from the optical axis.

The distance between an innermost edge of the droplet removal device with respect to the optical axis and the facing surface may be less than the distance between the fluid removal device and the facing surface.

The fluid removal device may be a two-phase extractor configured to extract a two-phase fluid. The fluid removal device may comprise a plurality of discrete openings in a surface of the fluid handling structure. The openings may be defined in the surface in a pattern and configured to confine the immersion liquid to the immersion space. The immersion liquid is confined by removing a mixture of immersion liquid from the immersion space and by removing gas from the atmosphere outside the immersion liquid.

The openings of the fluid removal device may be arranged so as to pin a meniscus of the immersion liquid in the immersion space by creation of a gas flow.

The porous member may comprise a plurality of openings. The spacing between the openings may increase with increasing distance from the optical axis. An outlet area of each opening may decrease with increasing distance from the optical axis.

The droplet removal device may be configured to remove a droplet of immersion liquid that has become detached from the immersion liquid in the immersion space.

The porous member may be configured to remove a mixture of immersion liquid and gas.

The fluid removal device and the droplet removal device may have the same geometric shape in plan, and different sizes. The fluid removal device and the droplet removal device both may have an annular shape in plan. The fluid removal device and the droplet removal device both may have at least four sides.

The immersion lithographic apparatus may further comprise a suction device connected to both the fluid removal device and the droplet removal device. The suction device is to reduce the pressure at both the fluid removal device and the droplet removal device.

The immersion lithographic apparatus may further comprise a first suction device and a second suction device. The first suction device is configured to reduce the pressure at the fluid removal device. The second suction device is configured to reduce the pressure at the droplet removal device.

The fluid removal device may be configured substantially to prevent immersion liquid from passing beyond it.

In an embodiment there is provided an immersion lithographic apparatus comprising a projection system, a substrate table and a fluid handling system. The projection system has an optical axis. The substrate table is configured to hold a substrate. The substrate, a table, or both, defines a facing surface. The fluid handling structure is configured to supply an immersion liquid to an immersion space defined between the projection system and the facing surface. The fluid handling structure comprises a fluid removal device and a droplet removal device. The fluid removal device is configured to remove immersion liquid from the immersion space. The droplet removal device faces the facing surface and is configured to remove a droplet of immersion liquid. The droplet removal device is located further from the optical axis than the fluid removal device. The distance between at least a portion of the droplet removal device and the facing surface increases with increasing distance from the optical axis.

The portion may be provided at an outer portion of the droplet removal device with respect to the optical axis.

An inner portion of the droplet removal device may be located closer to the optical axis than said portion. The inner portion may be at a substantially constant distance from the facing surface.

The distance between an inner portion of the droplet removal device, which is located closer to the optical axis than said portion, and the facing surface may decrease with increasing distance from the optical axis.

The droplet removal device may comprise a porous member which faces the facing surface.

In an embodiment there is provided an immersion lithographic apparatus comprising a projection system, a substrate table and a fluid handling structure. The projection system has an optical axis. The substrate table is configured to hold a substrate. The substrate, a table, or both, defines a facing surface. The fluid handling structure is configured to supply an immersion liquid to an immersion space defined between the projection system and the facing surface. The fluid handling structure comprises a fluid removal device and a droplet removal device. The fluid removal device is configured to remove immersion liquid from the immersion space. The droplet removal device faces the facing surface and is configured to remove a droplet of immersion liquid. The droplet removal device is arranged to remove a droplet of immersion liquid on the facing surface that has become detached from the immersion liquid in the immersion space. The droplet is removed by contacting the droplet as the facing surface moves relative to the droplet removal device.

The droplet removal device may comprise a porous member which faces the facing surface.

The distance between at least a portion of the droplet removal device and the facing surface may increase with increasing distance from the optical axis.

In an embodiment there is provided a method of manufacturing a device. The method comprises confining immersion fluid in a space defined between a projection system, a facing surface which is defined by a substrate and/or a table, a fluid handling structure, and a meniscus of immersion fluid which extends between the fluid handling structure and the facing surface so as to form a main body of immersion fluid. The projection system is configured to project a beam of patterned radiation onto an imaging field at a target portion of the substrate. The substrate table is configured to hold the substrate.

The method may further comprise causing relative motion between the projection system and the substrate and/or substrate table so as to expose different target portions of the substrate. The method may further comprise removing a droplet of immersion liquid formed on the surface of the substrate and/or the substrate table before it re-attaches to the main body of immersion fluid using a droplet removal device. The droplet removal device may comprise a porous member which faces the facing surface.

The method may further comprise removing the main body of immersion fluid through a fluid removal device. The projection system may have an optical axis and the droplet removal device may be positioned further away from the optical axis than the fluid removal device.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
a projection system having an optical axis;
a substrate table configured to hold a substrate, the substrate, a table, or both, defining a facing surface; and
a fluid handling structure, located above the substrate table, configured to supply an immersion liquid to an immersion space defined between the projection system and the facing surface, the fluid handling structure comprising:
a fluid removal device arranged to remove immersion liquid from the immersion space; and
a droplet removal device arranged to remove a droplet of immersion liquid, wherein:
the droplet removal device is located further from the optical axis than the fluid removal device, and
the droplet removal device comprises a porous member which faces the facing surface.

2. The immersion lithographic apparatus according to claim 1, wherein the distance between at least a portion of the porous member and the facing surface increases with increasing distance from the optical axis.

3. The immersion lithographic apparatus according to claim 2, wherein the portion is provided at an outer portion of the porous member with respect to the optical axis.

4. The immersion lithographic apparatus according to claim 2, wherein an inner portion of the porous member, which is located closer to the optical axis than said portion, is at a substantially constant distance from the facing surface.

5. The immersion lithographic apparatus according to claim 2, wherein the distance between an inner portion of the porous member, which is located closer to the optical axis than said portion, and the facing surface decreases with increasing distance from the optical axis.

6. The immersion lithographic apparatus according to claim 1, wherein the distance between an innermost edge of the droplet removal device with respect to the optical axis and the facing surface is less than the distance between the fluid removal device and the facing surface.

7. The immersion lithographic apparatus according to claim 1, wherein the fluid removal device is a two-phase extractor configured to extract a two-phase fluid.

8. The immersion lithographic apparatus according to claim 1, wherein the fluid removal device comprises a plurality of discrete openings in a surface of the fluid handling structure, the openings defined in the surface in a pattern and configured to confine the immersion liquid to the immersion space by removing a mixture of (i) immersion liquid from the immersion space and (ii) gas from the atmosphere outside the immersion liquid.

9. The immersion lithographic apparatus according to claim 8, wherein the openings of the fluid removal device are arranged so as to pin a meniscus of the immersion liquid in the immersion space by creation of a gas flow.

10. The immersion lithographic apparatus according to claim 1, wherein:
the porous member comprises a plurality of openings, and
the spacing between the openings increases with increasing distance from the optical axis, and/or an outlet area of each opening decreases with increasing distance from the optical axis.

11. The immersion lithographic apparatus according to claim 1, wherein the droplet removal device is configured to remove a droplet of immersion liquid that has become detached from the immersion liquid in the immersion space.

12. The immersion lithographic apparatus according to claim 1, wherein the porous member is configured to remove a mixture of immersion liquid and gas.

13. The immersion lithographic apparatus according to claim 1, wherein the fluid removal device and the droplet removal device have the same geometric shape in plan, and different sizes.

14. The immersion lithographic apparatus according to claim 1, wherein the fluid removal device and the droplet removal device both have an annular shape in plan.

15. The immersion lithographic apparatus according to claim 1, further comprising a suction device connected to both the fluid removal device and the droplet removal device so as to reduce the pressure at both the fluid removal device and the droplet removal device.

16. The immersion lithographic apparatus according to claim 1, further comprising:
a first suction device configured to reduce the pressure at the fluid removal device; and
a second suction device configured to reduce the pressure at the droplet removal device.

17. The immersion lithographic apparatus according to claim 1, wherein the fluid removal device is configured substantially to prevent immersion liquid from passing beyond it.

18. An immersion lithographic apparatus comprising:
a projection system having an optical axis;
a substrate table configured to hold a substrate, the substrate, a table, or both, defining a facing surface; and
a fluid handling structure configured to supply an immersion liquid to an immersion space defined between the projection system and the facing surface, the fluid handling structure comprising:
a fluid removal device configured to remove immersion liquid from the immersion space; and
a droplet removal device that faces the facing surface and configured to remove a droplet of immersion liquid, wherein:
the droplet removal device is located further from the optical axis than the fluid removal device, and
the distance between at least a portion of the droplet removal device and the facing surface increases with increasing distance from the optical axis.

19. An immersion lithographic apparatus comprising:
a projection system having an optical axis;
a substrate table configured to hold a substrate, the substrate, a table, or both, defining a facing surface; and
a fluid handling structure configured to supply an immersion liquid to an immersion space defined between the projection system and the facing surface, the fluid handling structure comprising:
a fluid removal device configured to remove immersion liquid from the immersion space; and
a droplet removal device which faces the facing surface and configured to remove a droplet of immersion liquid, wherein:
the droplet removal device is arranged to remove a droplet of immersion liquid on the facing surface that has become detached from the immersion liquid in the immersion space by contacting the droplet as the facing surface moves relative to the droplet removal device.

20. A method of manufacturing a device, the method comprising:
confining immersion fluid in a space defined between a projection system, a facing surface which is defined by a substrate and/or a table, a fluid handling structure located above a substrate table configured to hold the substrate, and a meniscus of immersion fluid which extends between the fluid handling structure and the facing surface so as to form a main body of immersion fluid, the projection system configured to project a beam of patterned radiation along an optical axis onto an imaging field at a target portion of the substrate;
causing relative motion between the projection system and the substrate and/or substrate table so as to expose different target portions of the substrate;
removing immersion liquid from the immersion space using a fluid removal device of the fluid handling structure; and
removing a droplet of immersion liquid formed on the surface of the substrate and/or the table before it re-attaches to the main body of immersion fluid using a droplet removal device located above the substrate table and further from the optical axis than the fluid removal device, the droplet removal device comprising a porous member which faces the facing surface.

* * * * *